United States Patent
Teng

(10) Patent No.: US 6,387,595 B1
(45) Date of Patent: May 14, 2002

(54) ON-PRESS DEVELOPABLE LITHOGRAPHIC PRINTING PLATE HAVING AN ULTRATHIN OVERCOAT

(76) Inventor: Gary Ganghui Teng, 10 Kendall Dr., Nothborough, MA (US) 01532

(*) Notice: Subject to any disclaimer, the term of this patent is extended or adjusted under 35 U.S.C. 154(b) by 0 days.

(21) Appl. No.: 09/699,784

(22) Filed: Oct. 30, 2000

(51) Int. Cl.⁷ .............................. G03F 7/30; G03F 7/38
(52) U.S. Cl. ..................... 430/302; 430/303; 430/273.1
(58) Field of Search .................................. 430/306, 302

(56) References Cited

U.S. PATENT DOCUMENTS

| | | | |
|---|---|---|---|
| 3,458,311 A | * 7/1969 | alles | 96/35.1 |
| 5,258,263 A | 11/1993 | Cheema et al. | 430/309 |
| 5,506,090 A | * 4/1996 | Gardner, Jr. et al. | 430/302 |
| 5,516,620 A | 5/1996 | Cheng et al. | 430/138 |
| 5,599,650 A | 2/1997 | Bi et al. | 430/273.1 |
| 5,607,816 A | 3/1997 | Fitzgerald et al. | 430/271.1 |
| 5,616,449 A | 4/1997 | Cheng et al. | 430/302 |
| 5,677,108 A | 10/1997 | Chia et al. | 430/273.1 |
| 5,677,110 A | 10/1997 | Chia et al. | 430/302 |
| 5,776,654 A | 7/1998 | Vermeersch et al. | 430/169 |
| 5,997,993 A | 12/1999 | Bi et al. | 428/195 |
| 6,014,929 A | 1/2000 | Teng | 101/456 |
| 6,030,751 A | * 2/2000 | Ellis et al. | 430/302 |
| 6,071,675 A | 6/2000 | Teng | 430/302 |

FOREIGN PATENT DOCUMENTS

EP 0509514 a1 * 10/1992

* cited by examiner

Primary Examiner—Cynthia Hamilton

(57) ABSTRACT

This invention discloses an on-press developable lithographic plate comprising on a substrate a photosensitive layer and a top ultrathin ink and/or fountain solution soluble or dispersible overcoat with a coverage of 0.001 to 0.150 g/m². The incorporation of such an ultrathin overcoat can provide excellent white light stability, high contrast, excellent ink receptivity, and fast on-press development.

20 Claims, No Drawings

ON-PRESS DEVELOPABLE LITHOGRAPHIC PRINTING PLATE HAVING AN ULTRATHIN OVERCOAT

FIELD OF THE INVENTION

This invention relates to lithographic printing plates. More particularly, it relates to on-press developable lithographic plates having on a photosensitive layer an ultrathin overcoat.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask which is placed between the light source and the plate. With the advance of laser and computer technologies, laser sources have been increasingly used to directly expose a printing plate which is sensitized to a corresponding laser wavelength; photomask is unnecessary in this case.

Currently, most commercial lithographic plates require a development process after the plates being exposed and before put on press. A liquid developer is used to dissolve or disperse, and clean off the non-exposed areas (for negative plate) or the exposed areas (for positive plates).

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Among the patents describing on-press developable lithographic printing plates are U.S. Pat. Nos. 5,258,263, 5,407,764, 5,516,620, 5,561,029, 5,616,449, 5,677,110, 5,811,220, and 6,014,929.

An on-press developable lithographic plate generally comprises, at least, a substrate and a photosensitive layer. In order for an on-press developable plate to be useful, the non-hardened (for negative working plate) or the solubilized (for positive working plate) areas of the photosensitive layer should be able to be cleaned off completely on press with ink (for waterless plate) or with ink and/or fountain solution (for wet plate) during the initial press operation. Acceptable printed sheets should be achieved within limited impressions, preferably less than 5 impressions. The non-hardened or solubilized areas of the photosensitive layer should be able to be penetrated, softened, and dispersed or dissolved by ink and/or fountain solution within seconds; the softened, and dispersed or dissolved areas of the photosensitive layer will be absorbed by ink and/or fountain solution, and/or removed by the press offset roller and printing papers. Considering the limited amount of ink or fountain solution on a printing press and the high viscosity of the ink, it is very difficult to obtain a plate which is non-tacky and can be developed on press quickly and cleanly. Therefore, on-press developable lithographic plates have more stringent design criteria than conventional lithographic plates developed with liquid developers.

While an on-press developable lithographic plate consisting of a substrate and a photosensitive layer is useful, it often suffers from slow roll-up and ink scumming during on-press development process.

On-press developable lithographic plates having an overcoat on a photosensitive layer has been disclosed in the patent literature, including U.S. Pat. Nos. 5,677,110, 5,599,650, 5,677,108, and 5,997,993. Here, one purpose of the overcoat was to reduce tackiness and/or protect the photosensitive layer and substrate from humidity attack. The overcoat was coated at a coverage of 0.25 to 0.32 g/m$^2$. Such a high coating thickness is required to provide sufficient tackiness reduction and humidity impermeability.

While the overcoat is useful in reducing tackiness and/or humidity attack, the loss of oxygen inhibition can cause certain undesirable performance, such as higher white light sensitivity, ghosting or poor contrast (measured as longer Stouffer tail steps), and ink blinding (poor ink receptivity in imaging areas). The ink binding is often caused by free radical crosslinking reaction in the photosensitive layer and overcoat interface where the hydrophilic polymers in the overcoat are physically trapped or chemically bonded to the hardened photosensitive layer.

In order to address the ink blinding, ghosting, and white light stability issues, polymer containing free radical quenching groups has been formulated into the overcoat to retard polymerization on the photosensitive layer and overcoat interface (U.S. Pat. Nos. 5,599,650 and 5,677,108). However, the polymer containing free radical quenching groups is very expensive to make. It would be desirable if such an expensive polymer can be avoided in preparing a lithographic plate.

I have found that an on-press ink and/or fountain solution developable lithographic plate having on a substrate a photosensitive layer and a top ink and/or fountain solution soluble or dispersible ultrathin overcoat with a coverage of 0.001 to 0.150 g/m$^2$ can give excellent white light stability (for ultraviolet sensitive plate), high contrast (or short Stouffer tail steps), and excellent ink receptivity, while allowing fast on-press development without having initial ink-scumming.

SUMMARY OF THE INVENTION

It is an object of the present invention to provide an on-press ink and/or fountain solution developable lithographic printing plate with excellent white light stability (for ultraviolet sensitive plate), high contrast, and excellent ink receptivity, while allowing fast on-press development without having initial ink-scumming.

It is another object of the present invention to provide an on-press ink and/or fountain solution developable lithographic plate having on a photosensitive layer an ultrathin photo-insensitive overcoat with a coverage of from 0.001 to 0.150 g/m$^2$.

Further objects, features and advantages of the present invention will become apparent from the detailed description of the preferred embodiments.

According to the present invention, there has been provided a lithographic printing plate, comprising:

(a) a substrate;

(b) a photosensitive layer capable of hardening or solubilization upon exposure to an actinic radiation, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an adhesive fluid for ink; and (c) an overcoat with a coverage of from 0.001 to 0.150 $g/m^2$ which is soluble or dispersible in ink and/or fountain solution.

According to another aspect of the present invention, there has been provided a method of lithographically printing images on receiving media, comprising in order:

(a) providing a lithographic printing plate comprising (i) a substrate; (ii) a photosensitive layer capable of hardening or solubilization upon exposure to an actinic radiation, the non-hardened or solubilized areas of said photosensitive layer being soluble or dispersible in ink (for waterless plate) or in ink and/or fountain solution (for wet plate), and said photosensitive layer exhibiting an affinity or aversion substantially opposite to the affinity or aversion of said substrate to at least one printing liquid selected from the group consisting of ink and an adhesive fluid for ink; and (iii) an overcoat with a coverage of from 0.001 to 0.150 $g/m^2$ which is soluble or dispersible in ink and/or fountain solution;

(b) exposing said plate with an actinic radiation to cause hardening or solubilization of the exposed areas; and (c) contacting said exposed plate with ink (for waterless plate), or with ink and/or fountain solution (for wet plate) on a lithographic press to develop the photosensitive layer, and to lithographically print images from said plate to the receiving media.

DETAILED DESCRIPTION OF THE PREFERRED EMBODIMENTS

Any film-forming materials which are soluble or dispersible in ink and/or fountain solution can be used to prepare the overcoat. The overcoat should be substantially insensitive (in terms of hardening or solubilization) to the actinic radiation for the photosensitive layer. The overcoat can be coated through various coating methods, such as slot coating, roller coating, curtain coating, dip coating, and spray coating from a dilute solution of these materials. Vacuum vapor deposition or sputtering coating may be used to form a releasable interlayer for lower molecular weight materials.

The overcoat may comprise a water-soluble polymer or an ink soluble polymer. Blending of different polymers may be used to achieve certain desired properties, such as more controlled solubility. A polymeric emulsion or an inorganic or organic particulate dispersion (such as titanium dioxide pigment dispersion, copper phthalocyanine pigment dispersion, and colloidal silicates) may be dispersed in the polymer to enhance certain properties, such as non-tackiness.

Suitable water-soluble polymers include, for example, polyvinyl alcohol (including various water-soluble derivatives of polyvinyl alcohol), polyvinylpyrrolidone, poly(2-ethyl-2-oxazoline), polyethylene glycol, polypropylene glycol, ethylene glycol/propylene glycol copolymer, and gum Arabic. It is noted that commercially polyvinyl alcohol is usually prepared by first polymerizing an ester derivative of vinyl alcohol (such as vinyl acetate) and then hydrolyzing the polyvinyl alcohol ester (such as polyvinyl acetate). The degree of hydrolysis varies for different products. For example, Airvol 540, Airvol 425, and Airvol 125 have degrees of hydrolysis of about 88%, 96%, and 99.3%, respectively. Therefore, the term polyvinyl alcohol used in this patent refers to all the partially and fully hydrolyzed polyvinyl alcohols which are water-soluble.

Various additives may be added into the overcoat to enhance its performance. For overcoat deposited from a solution or dispersion, various additives, such as surfactant, wetting agent, defoamer, leveling agent, and dispersing agent, can be added into the overcoat formulation to facilitate, for example, the coating process. Certain plasticizer or surfactant may be added to facilitate the penetration of ink and/or fountain solution during on-press development process. Various nonionic surfactants and ionic surfactants can be used. For water-soluble or dispersible overcoat, the surfactants are preferably soluble in water. Examples of surfactants useful in this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added at from 0.1 to 50% by weight of the overcoat, preferably from 1 to 20%.

The overcoat can be a single layer or can consist of more than one sublayers of different compositions. Intermixing between the overcoat and the photosensitive layer may take place, especially near the interface. The intermixed interface may form a separate layer which, in this patent, may be considered as part of the photosensitive layer (if photosensitive enough) or part of the overcoat (if radiation-insensitive enough).

The coverage of the overcoat is preferably from 0.001 to 0.150 $g/m^2$, more preferably from 0.002 to 0.090 $g/m^2$, and most preferably from 0.004 to 0.040 $g/m^2$. The coating coverage ($g/m^2$) is defined as the total weight of the dried coating (g) per given coated substrate sheet area ($m^2$). It is noted that here the area is measured as the substrate sheet dimension (length by width), not the microscopic surface area.

The substrate employed in the lithographic plates of this invention can be any lithographic support. Such a substrate may be a metal sheet, a polymer film, or a coated paper. Aluminum (including aluminum alloys) sheet is a preferred metal support.

Particularly preferred is an aluminum support which has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the photosensitive layer; commonly, a wet lithographic plate has a hydrophilic substrate and an oleophilic photosensitive layer. For waterless plate, the substrate should have an oleophilic or oleophobic surface, depending on the surface properties of the photosensitive layer.

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Metal fluoride and metal phosphate can also be used for surface treatment to form a hydrophilic barrier layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

For preparing printing plates of the current invention, any photosensitive layer (also called radiation-sensitive layer) is suitable which is capable of hardening or solubilization upon exposure to an actinic radiation of any wavelength from ultraviolet to infrared region (150 to 1200 nm), and is soluble or dispersible in ink (for waterless plate) or in ink and/or fountain solution (for wet plate) in the non-hardened or solubilized areas. Here hardening means becoming insoluble and non-dispersible in ink and/or fountain solution (negative-working), and solubilization means becoming soluble or dispersible in ink and/or fountain solution (positive-working). The radiation can be a conventional light source, such as a high pressure mercury lamp, a xenon lamp, or a fluorescence lamp (usually requiring a mask), or can be a laser source which directly images according to digital imaging information. The photosensitive layer preferably has a coverage of from 0.1 to 3.0 $g/m^2$, more preferably from 0.4 to 1.5 $g/m^2$.

Photosensitive layer suitable for the current invention may be formulated from various photosensitive materials. The components ratios (such as monomer to polymer ratio) are usually different from conventional plates designed for development with a regular liquid developer. Various additives may be added to, for example, enhance on-press developability. Various additives useful for conventional photosensitive layer can also be used. Such additives include pigment, dye, exposure indicator, and stabilizer.

Various surfactants may be added into the photosensitive layer to allow or enhance the on-press ink and/or fountain solution developability. Both polymeric and small molecule surfactants can be used. However, it is preferred that the surfactant has low or no volatility so that it will not evaporate from the photosensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (such as Tergitol MIM-FOAM from Union Carbide, and Pluronic L43, L64, 1107, P103 and 10R5 from BASF); ethoxylated or propoxylated acrylate oligomers (such as polyethoxylated (20) trimethylolpropane triacrylate, polyethylene glycol (600) diacrylate, and polypropoxylated (6) trimethylolpropane triacrylate, SR415, SR610, and SR501, respectively, from Sartomer Company, Exton, Pa.); and polyethoxylated alkylphenols and polyethoxylated fatty alcohols (such as Triton X-100, Triton X-102, Triton X-165, Triton X-305, Triton X-405, Triton X-705, Triton X-45, Triton X-114, Triton CF-10, Triton CA, and Triton DF-12 from Union Carbide). The nonanionic surfactant can be added at from 0.1 to 30% by weight of the photosensitive layer, preferably from 1 to 15%.

A particulate dispersion may be added into the photosensitive layer to enhance, for example, the developability and non-tackiness of the plate, as described in U.S. Pat. No. 6,071,675, the entire disclosure of which is hereby incorporated by reference.

Photosensitive materials useful in negative-working wet plates of this invention include, for example, photopolymers (comprising acrylic monomers, polymeric binders, and photoinitiators), light-sensitive compositions comprising polyfunctional vinyl ethers or epoxy monomers and cationic photoinitiators, and polycondensation products of diazonium salts.

Photosensitive materials useful in positive-working wet plates of this invention include, for example, diazo-oxide compounds such as benzoquinone diazides and naphthoquinone diazides.

Photosensitive oleophobic materials useful in waterless plates of this invention include, for example, compositions comprising polymers having perfluoroalkyl groups and crosslinkable terminal groups, and compositions comprising polysiloxane and crosslinkable resins.

In a preferred embodiment as for negative-working wet lithographic printing plates of this invention, the photosensitive layer comprises at least one polymeric binder (with or without ethylenic functionality), at least one polymerizable ethylenically unsaturated monomer (or oligomer) having at least one terminal ethylenic group capable of forming a polymer by free-radical polymerization, at least one photosensitive free-radical initiator (including sensitizer), and other additives such as surfactant, dye or pigment, radiation exposure-indicating dye (such as leuco crystal violet, azobenzene, 4-phenylazodiphenylamine, and methylene blue dyes), and free-radical stabilizer (such as methoxyhydroquinone). Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer. Suitable free-radical polymerizable monomers (including oligomers) include multifunctional acrylate monomers or oligomers, such as acrylate and methacrylate esters of ethylene glycol, trimethylolpropane, pentaerythritol, ethoxylated ethylene glycol and ethoxylated trimethylolpropane, multifunctional urethanated acrylate and methacrylate (such as Sartomer CN970 and CN975 from Sartomer Company, Exton, Pa.), and epoxylated acrylate or methacrylate (such as Sartomer CN104 and CN120 from Sartomer Company, Exton, Pa.), and oligomeric amine diacrylates. Suitable photosensitive free-radical initiators include the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine (such as 2,4-bis(trichloromethyl)-6-(1-(4-methoxy)naphthyl)-1,3,5-triazine), and titanocene (bis($\eta^9$-2,4-cyclopentadien-1-yl), bis[2,6-difluoro-3-(1H-pyrrol- 1-yl)phenyl) titanium).

In a second preferred embodiment as for negative-working wet lithographic printing plates of this invention, the photosensitive layer comprises a polycondensation product of diazonium salt (diazo resin), with or without a polymeric binder, and other additives such as colorants, stabilizers, exposure indicators, surfactants and the like. Particularly useful diazo resins include, for example, the condensation product of p-diazodiphenylamine and formaldehyde, the condensation product of 3-methoxy-4-diazodiphenylamine and formaldehyde, and the diazo resins of U.S. Pat. Nos. 3,867,147, 4,631,245 and 5,476,754, and references noted therein. Particularly useful polymeric binders for use with such diazo resins include, for examples, acetal polymers and their derivatives as described in U.S. Pat. Nos. 4,652,604, 4,741,985, 4,940,646, 5,169,897 and 5,169,898, and references noted therein; and polymeric binders with carboxylic acid groups, as described in U.S. Pat. No. 4,631,245.

In another preferred embodiment as for negative-working wet lithographic printing plates of this invention, the photosensitive layer comprises at least one polyfunctional vinyl ether or epoxy monomer (or oligomer), at least one cationic photoinitiator (including sensitizer), optionally one or more polymeric binders, and other additives such as colorants, stabilizers, exposure indicators, surfactants and the like. Examples of useful polyfunctional epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate, triarylsulfonium hexafluorophosphate, and s-triazine (such as 2,4-bis(trichloromethyl)-6-(1-(4-methoxy)naphthyl)-1,3,5-triazine). Examples of useful polymeric binders are polybutylmethacrylate, polymethylmethacrylate and cellulose acetate butyrate.

It is noted that lithographic printing plates suitable for exposure with a conventional actinic light source through a photo mask can also be directly imagewise exposed with a laser having similar actinic wavelength. Because of the easy availability of certain visible and infrared lasers, such as violet laser (430 nm), argon laser (488 nm), frequency-doubled Nd/YAG laser (532 nm), diode laser (830 nm) and Nd/YAG laser (1064 nm), plates for laser imaging are often sensitized to the wavelength of one of these lasers. For example, some visible light sensitive initiators, such as Irgacure 784 (a free-radical initiator with strong absorption from 400 to 535 nm, from Ciba Geigy), can be used to formulate into the photosensitive layer to make the plate imagable with violet laser, argon laser or frequency-doubled Nd/YAG laser; an acid crosslinkable photosensitive layer with addition of an infrared dye having strong absorption at about 830 nm and a thermo-sensitive latent Bronsted acid can be exposed with diode laser (usually followed by thermal treatment) to cause hardening in the exposed areas. Examples of such photosensitive layers can be found in U.S. Pat. Nos. 4,486,529, 5,663,037, 5,491,046 and 5,641,608, and references noted therein.

The mechanisms for the photohardening or photosolubilization of photosensitive materials may be different for different photosensitive materials and imaging radiations. For example, a certain radiation can directly cause hardening or solubilization of a certain molecule; a certain radiation can activate a certain initiator (and/or coinitiator or sensitizer) which in turn causes hardening or solubilization of a certain molecule; and a certain radiation (usually an infrared light) can be absorbed by a absorbing dye or pigment to generate heat which heat in turn indirectly (through an initiator) or directly causes hardening or solubilization of a certain molecule. It is noted that, in order to clarify and simplify the terminology of this patent, in this patent, any radiation which can directly or indirectly cause hardening or solubilization of a photosensitive material is defined as actinic radiation for that photosensitive material. Such a radiation can be a conventional light or laser.

The plate can be exposed through a photomask film with a conventional light source or can be directly exposed from a laser (or focused conventional light source, such as UV light) according to digital imaging information. For direct exposure (or called digital exposure), the laser or focused light is scanned across the plate, and no photomask is needed. The exposed plate is then mounted on a lithographic press to develop with ink and/or fountain solution and then print out regular printed sheets. Alternatively, the plate can be exposed on a plate cylinder of a lithographic printing press, and the exposed plate can be directly developed on press with ink and/or fountain solution and then print out regular printed sheets. The plate may be sensitized to a UV, visible, or infrared radiation. For direct digital imaging, a laser is usually used as the radiation source. Visible lasers (including violet laser) and infrared laser are currently widely used for graphic arts imaging, and can be used for the digital exposure of this invention. A plate sensitized to an infrared laser (such as laser diode or Nd/YAG laser) or a violet laser is especially useful for on-press imaging and development because of its white or yellow light stability.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing: Science and Technology" by Pappas, Plenum Press, New York, 1992.

The fountain solution used in this application can be any fountain solution used in lithographic printing. Fountain solution is used in the wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the plate. Various fountain solution compositions are described in U.S. Pat. Nos. 4,030,417 and 4,764,213.

For conventional wet press, usually fountain solution is applied (to contact the plate) first, followed by contacting with ink roller. For press with integrated inking system, the ink and fountain solution are emulsified by the various press rollers before transferred to the plate as emulsion of ink and fountain solution. The ink and fountain solution may be applied at any combination or sequence, as needed for the plate. There is no particular limitation in this invention. The recently introduced single fluid ink by Flink Ink Company, which can be used for printing wet lithographic plate without the use of fountain solution, can also be used for the on-press developable plate of this invention.

For plates with rough and/or porous surface capable of mechanical interlocking with a coating deposited thereon, a thin releasable interlayer soluble or dispersible in a developer for the photosensitive layer may be deposited between the substrate and the photosensitive layer. Here the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference.

The photosensitive layer may be conformally coated onto a roughened substrate (for example, with Ra of larger than 0.5 micrometer) at thin coverage (for example, of less than 0.8 g/m$^2$) so that the plate can have microscopic peaks and valleys on the photosensitive layer coated surface and exhibit low tackiness and good block resistance, as described in U.S. patent application Ser. No. 09/605018, now U.S. Pat. No. 6,242,156 B1 the entire disclosure of which is hereby incorporated by reference. Likewise, the thin overcoat may also be substantially conformally coated onto the photosensitive layer if the photosensitive layer is conformally coated onto a roughened substrate surface. This will allow reduced tackiness and better block resistance.

Also, it will allow more uniform microscopic coverage of the overcoat on the photosensitive layer, providing more uniform microscopic performance of the plate.

The invention is further illustrated by the following non-limiting examples of its practice. Unless specified, all the values are by weight.

EXAMPLE 1

Electrochemically roughened, anodized, and polyvinylphosphonic acid treated aluminum sheets were used as the plate substrates. The aluminum substrate was first coated with a releasable interlayer (RL-1) using a #6 Meyer rod, followed by drying in an oven at 85° C. for 5 min.

RL-1

| Component | Weight ratios |
|---|---|
| Airvol 540 (Polyvinyl alcohol from Air Products and Chemicals Company) | 0.20 |
| Zonyl FSO (Perfluorinated surfactant from DuPont) | 0.02 |
| Water | 100.00 |

The releasable interlayer coated substrate was further coated with a photosensitive layer PS-1 using a #6 Meyer rod, followed by drying in an oven at 85° C. for 5 min.

PS-1

| Component | Weight ratios |
|---|---|
| Neocryl B-728 (Polymer from Zeneca) | 2.673 |
| Sartomer SR-399 (Monomer from Sartomer) | 6.388 |
| Pluronic L43 (Surfactant from BASF) | 0.607 |
| Leuco crystal violet | 0.109 |
| Irganox 1035 (Antioxidant from Ciba-Geigy) | 0.011 |
| 2,6-Di-tert-butyl-4-methylphenol | 0.011 |
| 2,4-Bis(trichloromethyl)-6-(4-methoxy-naphth-1-yl)-s-triazine | 0.201 |
| 2-Butanone | 24.259 |
| Acetone | 65.741 |

The photosensitive layer coated substrate was further coated with a water-soluble overcoat at a coverage as listed in Table 1, followed by drying in an oven at 85° C. for 5 min. The overcoat was coated from an aqueous solution of polyvinyl alcohol (Airvol 540 or Airvol 205, from Air Products and Chemicals Company) with addition of about 0.02% by weight of Zonyl FSO surfactant (from DuPont) relative to the solution total weight.

The plate thus prepared was placed under a negative photomask having a 21-step Stouffer sensitivity guide and exposed to a UV light with an emission peak at about 364 nm for 2 min. using an INSTANT 2 VACUUM PRINTER 24×28 exposure device (manufactured by Berkey Technical Co., New York). A small unexposed area of the plate was exposed to a regular fluorescence office light for 100 min. (with the rest areas of the plate being covered) to test white light stability of the plate. The plate was then tested on a wet lithographic press (AB Dick 360) equipped with integrated inking system. The exposed plate was directly mounted on the plate cylinder of the press. The press was started for 10 rotations, and the ink roller (carrying emulsion of ink and fountain solution) was then applied to the plate cylinder to rotate until the plate showed clean background. The plate cylinder was then engaged with the blanket cylinder and printed with papers. The plate continued to run for a total of 200 printed sheets.

TABLE 1

| Overcoat polymer | Overcoat coverage (g/m²) | Roll-up (Rotations) | Ink receptivity | Stouffer steps (Solid-Tail) | Roll-up in white light exposed areas |
|---|---|---|---|---|---|
| No overcoat | None | 40 | Good | 3–5 | Clean |
| Airvol 205 | 0.01 | 10 | Good | 5–7 | Clean |
| Airvol 205 | 0.02 | 10 | Good | 6–8 | Clean |
| Airvol 540 | 0.02 | 10 | Good | 6–9 | Clean |
| Airvol 205 | 0.04 | 10 | Good | 7–11 | Clean |
| Airvol 540 | 0.05 | 10 | Fair | 8–12 | Slight toning |
| Airvol 205 | 0.10 | 10 | Fair | 9–14 | Some toning |
| Airvol 205 | 0.20 | 10 | Poor | 9–16 | Heavy toning |
| Airvol 205 | 0.40 | 10 | Poor | 10–18 | Heavy toning |

The press test results are listed in Table 1. All plates showed well defined imaging and no earlier indication of wearing at 200 sheets (No further press run was conducted.). The plates with overcoat cleaned up at about 10 plate rotations after engaging ink roller, while the plate without overcoat did not clean up until about 40 rotations. However, the plates with thicker overcoat showed ink blinding (poor ink receptivity), very high tail steps (ghosting), and poor white light stability (toning after exposure to white light for 100 min.). The plates with a very thin overcoat showed overall good results (fast roll-up, good ink receptivity, short tail steps, and good white light stability). Here the roll-up was recorded as the number of plate rotations after the ink roller contacting the plate. The Stouffer steps were measured from the printed sheet at 200 impressions. Roll-up in white light exposed areas is recorded as the cleaning up of the areas exposed with office fluorescence light for 100 min. at rotations required to clean up the unexposed areas of the plate.

EXAMPLE 2

The plates were coated the same as in EXAMPLE 1 except that there is no releasable interlayer between the substrate and the photosensitive layer. The photosensitive layer (PS-1) was directly coated onto the electrochemically grained, anodized, and polyvinyl phosphonic acid treated substrate with a #6 Mayer rod. The photosensitive layer coated substrate was further coated with a water-soluble overcoat at a coverage as listed in Table 2. Each coating was dried in an oven at 85° C. for 5 min. The plates were then tested with the same procedure as in Example 1.

TABLE 2

| Overcoat polymer | Overcoat coverage (g/m²) | Roll-up (Rotations) | Ink receptivity | Stouffer steps (Solid-Tail) | Roll-up in white light exposed areas |
|---|---|---|---|---|---|
| No overcoat | None | 70 | Good | 4–6 | Clean |
| Airvol 205 | 0.01 | 40 | Good | 5–7 | Clean |
| Airvol 540 | 0.02 | 40 | Good | 6–9 | Clean |
| Airvol 540 | 0.05 | 40 | Fair | 8–12 | Slight toning |
| Airvol 205 | 0.10 | 40 | Fair | 9–14 | Some toning |
| Airvol 205 | 0.20 | 40 | Poor | 9–16 | Heavy toning |
| Airvol 205 | 0.40 | 40 | Poor | 10–17 | Heavy toning |

As shown in Table 2, the plates with overcoat cleaned up at about 40 plate rotations after contacting with ink roller, while the plate without overcoat did not clean up until about 70 rotations. However, the plates with thicker overcoat showed ink blinding (poor ink receptivity), very high tail steps, and poor white light stability (toning after exposure to white light for 100 min.). The plates with a very thin overcoat showed overall better results than plates without overcoat or with thicker overcoat.

I claim:
1. A method of lithographically printing images on receiving media, comprising in order:
  (a) providing a lithographic printing plate comprising (i) a hydrophilic substrate; (ii) an oleophilic photosensitive layer capable of hardening or solubilization upon exposure to an actinic radiation, the non-hardened or solubilized areas of said photosensitive layer being soluble or dispersible ill ink and/or fountain solution; and (iii) an overcoat with a coverage of from 0.001 to 0.150 g/m² which is soluble or dispersible in ink and/or fountain solution;
  (b) exposing said plate with an actinic radiation to cause hardening or solubilization of the exposed areas; and
  (c) contacting said exposed plate with ink and/or fountain solution on a lithographic press to remove the overcoat and the non-hardened or solubilized areas of said photosensitive layer, and to lithographically print images from said plate to the receiving media.
2. The method of claim 1 wherein said overcoat has a coverage of from 0.002 to 0.090 g/m².
3. The method of claim 1 wherein said overcoat has a coverage of from 0.004 to 0.040 g/m².
4. The method of claim 1 wherein said overcoat is soluble or dispersible in fountain solution and comprises a water-soluble polymer.
5. The method of claim 1 wherein said overcoat is soluble or dispersible in ink and comprises an ink-soluble polymer.
6. The method of claim 1 wherein said overcoat is soluble or dispersible in emulsion of ink and fountain solution.

7. The method of claim 1 wherein said substrate is hydrophilic; and said photosensitive layer is oleophilic, and comprises an oleophilic polymeric binder, a monomer or oligomer with at least one acrylate or methacrylate functional group, and a photosensitive free-radical initiator.

8. The method of claim 1 wherein said plate is exposed with an actinic radiation through a photomask.

9. The method of claim 1 wherein said plate is digitally exposed with an actinic laser selected from the group consisting of ultraviolet, visible, and infrared lasers.

10. The method of claim 9 wherein said visible laser is a violet laser.

11. The method of claim 9 wherein said actinic laser is an infrared laser.

12. The method of claim 1 wherein said plate is exposed with an actinic radiation off the press and then mounted onto a plate cylinder of a lithographic press for on-press development with ink and/or fountain solution, and lithographic printing.

13. The method of claim 1 wherein said plate is exposed with an actinic laser according to digital imaging information while mounted on a plate cylinder of a lithographic press.

14. The method of claim 1 wherein said substrate has a roughened surface comprising peaks and valleys, said photosensitive layer is substantially conformally coated on the roughened substrate surface, and said overcoat is substantially conformally coated on the photosensitive layer surface, so that the surface of said overcoat has peaks and valleys substantially corresponding to the major peaks and valleys of the substrate microscopic surface; and said substrate has an average surface roughness Ra of 0.2 to 2.0 microns, said photosensitive layer has an average coverage of 0.1 to 2.0 g/m$^2$, and the average height of the valleys on the overcoat surface is at least 0.1 microns below the average height of the peaks on the overcoat surface.

15. A method of lithographically printing images on receiving media, comprising in order:

(a) providing a lithographic printing plate comprising (i) a hydrophilic substrate; (ii) an oleophilic photosensitive layer capable of hardening upon exposure to an actinic radiation and soluble or dispersible in ink and/or fountain solution, said photosensitive layer comprising a polymeric binder, a free radical polymerizable ethylenically unsaturated monomer or oligomer having at least one terminal ethylenic group, and a free-radical initiator; and (iii) a water-soluble or dispersible overcoat with a coverage of from 0.001 to 0.150 g/m$^2$;

(b) exposing said plate with an actinic radiation to cause hardening of the exposed areas; and (c) contacting said exposed plate with fountain solution or with both ink and fountain solution on a lithographic press to remove the overcoat and the non-hardened areas of said photosensitive layer, and to lithographically print images from said plate to the receiving media.

16. The method of claim 15 wherein said overcoat has a coverage of from 0.002 to 0.090 g/m$^2$.

17. The method of claim 15 wherein said overcoat has a coverage of from 0.004 to 0.040 g/m$^2$.

18. The method of claim 15 wherein said overcoat comprises a water-soluble polymer.

19. The method of claim 15 wherein said substrate has a roughened surface comprising peaks and valleys, said photosensitive layer is substantially conformally coated on the roughened substrate surface, and said overcoat is substantially conformally coated on the photosensitive layer surface, so that the surface of said overcoat has peaks and valleys substantially corresponding to the major peaks and valleys of the substrate microscopic surface; and said substrate has an average surface roughness Ra of 0.2 to 2.0 microns, said photosensitive layer has an average coverage of 0.1 to 2.0 g/m$^2$, and the average height of the valleys on the overcoat surface is at least 0.1 microns below the average height of the peaks on the overcoat surface.

20. The method of claim 19 wherein said average height of the valleys on the overcoat surface is at least 0.1 microns below the average height of the peaks on the substrate surface.

* * * * *